(12) United States Patent
Gal et al.

(10) Patent No.: US 7,425,469 B2
(45) Date of Patent: Sep. 16, 2008

(54) METHOD FOR ENCAPSULATING AN ELECTRONIC COMPONENT USING A FOIL LAYER

(75) Inventors: Wilhelmus Gerardus Jozef Gal, Kilder (NL); Franciscus Bernardus Antonius De Vries, Eibergen (NL)

(73) Assignee: Fico B.V. (NL)

( * ) Notice: Subject to any disclaimer, the term of this patent is extended or adjusted under 35 U.S.C. 154(b) by 423 days.

(21) Appl. No.: 10/514,379

(22) PCT Filed: May 12, 2003

(86) PCT No.: PCT/NL03/00346

§ 371 (c)(1),
(2), (4) Date: Jul. 22, 2005

(87) PCT Pub. No.: WO03/096408

PCT Pub. Date: Nov. 20, 2003

(65) Prior Publication Data

US 2006/0166408 A1 Jul. 27, 2006

(30) Foreign Application Priority Data

May 14, 2002 (NL) .................................... 1020594

(51) Int. Cl.
*H01L 21/50* (2006.01)
*H01L 21/48* (2006.01)
*H01L 21/44* (2006.01)
*H01L 23/495* (2006.01)
*H01L 23/28* (2006.01)
*H01L 23/31* (2006.01)

(52) U.S. Cl. .................... 438/118; 438/121; 438/106; 438/123; 438/124; 257/676; 257/787; 257/E23.127; 257/E23.116; 257/E23.125

(58) Field of Classification Search ................. 438/118, 438/121, 106, 123, 124; 257/676, 787, E23.127, 257/E23.116, E23.125
See application file for complete search history.

(56) References Cited

U.S. PATENT DOCUMENTS 6,033,933 A 3/2000 Hur

FOREIGN PATENT DOCUMENTS

WO WO 00 66340 A 11/2000
WO WO 01 69669 A 9/2001

*Primary Examiner*—Luan Thai
(74) *Attorney, Agent, or Firm*—The Webb Law Firm

(57) ABSTRACT

The invention relates to a method for encapsulating an electronic component, in particular a semiconductor, fixed on a carrier, comprising the processing steps of: a) placing at least one foil layer in a mould, b) placing the carrier in contact with the foil layer with the side remote from the component, and c) encapsulating the electronic component with encapsulating material, wherein the foil layer undergoes a treatment whereby the adhesion of the foil layer is increased such that it adheres to the carrier. The invention also relates to a foil material for applying during such a method.

15 Claims, 1 Drawing Sheet

METHOD FOR ENCAPSULATING AN ELECTRONIC COMPONENT USING A FOIL LAYER

BACKGROUND OF THE INVENTION

1. Field of the Invention

The invention relates to a method for encapsulating an electronic component, in particular a semiconductor, fixed on a carrier comprising the processing steps of: a) placing at least one foil layer in a mould, b) placing the carrier in contact with the foil layer with the side remote from the component, and c) encapsulating the electronic component with encapsulating material. The invention also relates to a foil for applying such a method.

2. Description of the Prior Art

The International patent application WO 00/66340 discloses a method for manufacturing encapsulated electronic components including the shielding of a side of the support of electronic components with an adhesive film. In a specific embodiment the adhesive film comprises an adhesive layer that becomes adhesive as a result of an increase in temperature of the film in the mould. This method has the problem that the duration of the processing step of moulding the electronic components includes the time to make the film adhesive, furthermore the level of adhesion of the film is difficult to control.

The encapsulating of electronic components, in particular semiconductor products, is a precisely controlled process wherein use is generally made of so-called transfer moulding. An object for (partial) encapsulation is herein placed in a mould. Liquid encapsulating material is forced into the mould by means of one or more plungers, wherein one or more mould cavities preformed in the mould are filled with encapsulating material. After curing of the encapsulating material the mould is opened and the product (partially) encapsulated with encapsulating material is taken out of the mould. In order to prevent the encapsulating material adhering to the mould, use is made in particular applications of an additional foil layer for placing in the mould. The encapsulating material is herein carried between the foil layer and the product for (partial) encapsulation. The encapsulating material thus remains separated from the mould.

When one or more housings manufactured from encapsulating material are arranged on a flat carrier, the encapsulating material can be forced unilaterally against the carrier and the opposite side of the carrier remains free of encapsulating material. In many products it is of great importance that this side remote from the encapsulating material remains free of encapsulating material, among other reasons because of the contact positions with which it must be possible to later connect the product for electrical conduction. However, an increasing number of products are being applied wherein the carrier is provided with openings/recesses through which, if specific measures are not taken, the encapsulating material can get to the side of the carrier which is to be kept clean. The solutions for preventing this are, among others, to apply the encapsulating material on one side in the still unopened position of the carrier followed by removal of a material layer from the carrier (for instance by means of etching) after the encapsulating material has been applied. It will be apparent that this includes additional treatments, which has the effect of increasing costs. A further solution in practice is, prior to applying encapsulating material, to adhere a protective layer against the carrier provided with openings. The openings in the thus treated (assembled) carrier are closed. The closed carrier can now be (partially) encapsulated. After the (partially) encapsulated carrier has been removed from the mould, the protective layer is removed from the carrier once again. A problem here is making the contact side of the (partially) encapsulated product properly clean again. This method also has the effect of considerably increasing costs.

The International patent application WO 00/66340 discloses a method for manufacturing encapsulated electronic components including the shielding a side of the support of electronic components with an adhesive film. In a specific embodiment the adhesive film comprises an adhesive layer that becomes adhesive as a result of an increase in temperature of the film in the mould. This method has the problem that the duration of the processing step of moulding the electronic components includes the time to make the film adhesive, furthermore the level of adhesion of the film is difficult to control.

The object of the present invention is to provide a method and means for encapsulating an electronic component, in particular a semiconductor, fixed on a carrier, wherein a contact side of the carrier is kept fee of encapsulating material in economic and controlled manner.

SUMMARY OF THE INVENTION

The invention provides for this purpose a method for encapsulating an electronic component, in particular a semiconductor, fixed on a carrier, comprising the processing steps of: a) placing at least one foil layer in a mould, b) placing the carrier in contact with the foil layer with the side remote from the components, and c) encapsulating the electronic component with encapsulating material, characterized in that the foil layer undergoes a treatment whereby the adhesion of the foil layer is increased such that it adheres to the carrier. The term "treatment" is here understood to mean a treatment or process which is to a greater or lesser extent physical. Instead of a complex pre-treatment of the carrier, a foil layer is now simply placed in the mould. This is a simple operation in which much experience has already been acquired in practice. The special feature of the invention is now that the properties of the foil are influenced such that the foil layer adheres to a greater or lesser degree to the side of the carrier remote from the side to which the encapsulating material must be applied. Instead of a complex pre-treatment or post-treatment of the carrier to prevent this being permeable to encapsulating material, use is simply made according to the invention of the existing technology of placing a foil layer in the mould. The word "treatment" is understood to mean a treatment or process which the carrier undergoes that is to a greater or lesser extent physical. When the foil layer and carrier are brought into mutual contact, the correct force can thus be exerted immediately to realize the desired connection. The number of processing steps hereby remains limited. On the other hand it is also possible, when specific conditions require, to place the foil and the carrier in mutual contact and only then to increase the adhesion of the foil. It is furthermore noted that it can be advantageous during arranging of the foil to vacuum the space between the carrier and the foil, this to prevent inclusion of gases. The present invention furthermore has the advantages that it provides freedom in choice of the type(s) of adhesion-increasing treatment(s) and that it provides freedom in the duration of the adhesion-increasing treatment. As the adhesion-increasing treatment is a process step that is separated from the processes that take place in the mould it is also better to control and to monitor than the adhesion-increasing treatment according the prior art.

The adhesion-increasing treatment can for instance comprise a temperature increase of the foil, optionally combined with corona, plasma or like treatment with a similar effect. Traditionally the surface tension of the foil is influenced with a corona treatment, but test results indicate that it is also possible to influence the adhesion of foil material with a corona treatment. Results have been obtained herein during tests wherein after an adhesion-increasing treatment has been carried out the foil adheres particularly to a contact surface of the carrier consisting at least substantially of copper. In addition to the examples mentioned here, other treatments of the foil can of course also be envisaged, such as for instance exposure or a chemical treatment.

In a preferred application of the method the foil undergoes a subsequent treatment after encapsulation of the electronic component with encapsulating material, whereby the adhesion of the foil layer is decreased such that it adheres less to the than during encapsulation of the electronic component with encapsulating material. Such a treatment for reducing adhesion can for instance comprise a temperature decrease of the foil. With such a subsequent treatment the foil can be released more readily from the carrier and there is less chance of foil residue being left behind on the carrier.

For a simple supply of the foil, it can be unwound from a roll and then moved through the mould. Such a method can be at least partially taken over from the prior art method for processing of foil. In another advantageous application of the method according to the invention, the foil can be used a number of times; a fail which has been used once does not have to be discarded but can be refused. This has the advantage, among others, that the costs of using the foil can be reduced and that the method has less of an environmental impact.

It is recommended to place the foil layer only shortly before applying the encapsulation. This reduces the risk of damage to the foil material by previous processing steps. An example hereof is the connection of the electronic component by means of connecting wires (wire bounding) which takes place at relatively high temperatures (usually 240-260° C.). A further advantage of the method according to the invention is that it is possible to thus process assembled carriers of for instance a combination of ceramic and metal, wherein the chance of damaging such carriers ("crack") is also reduced.

The invention also provides a foil for applying the above described method, characterised in that the foil comprises a carrier layer having arranged there an adhesive layer which can be activated. The adhesive layer which can be activated can for ice comprise a thermoplastic plastic, while the carrier layer can consist of paper. Conversely, it is also possible for the carrier layer to consist of plastic. Yet another option is that the carrier layer consists of a non-ferrous metal. This of course also includes alloys, for instance alloys with aluminium. The advantages as described above can be realized with such a foil. The foil can be manufactured relatively cheaply and costs can be further reduced when the foil is reusable. Advantageous results have been obtained in practice with an adhesive layer of polypropylene/polyethylene which can be activated and which has a melting range at about 140° C. It is of course necessary to opt for an adhesive layer that can be activated which is inert to many substances.

BRIEF DESCRIPTION OF THE DRAWINGS

The invention will be further elucidated with reference to the non-limitative embodiments show in the following figures. Herein:

FIG. 2 shows a schematic view of route followed by a foil material from a roll during an advantageous embodiment variant of the method according to the

DETAILED DESCRIPTION OF THE PREFERRED EMBODIMENTS

Figure 1A:
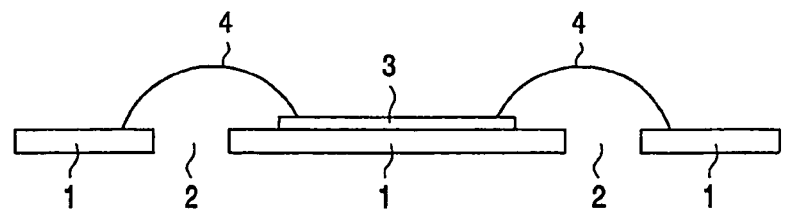
FIG. 1A shows a schematic side view of a carrier provided with an electronic component, in which carrier there are openings.
Figure 1B:
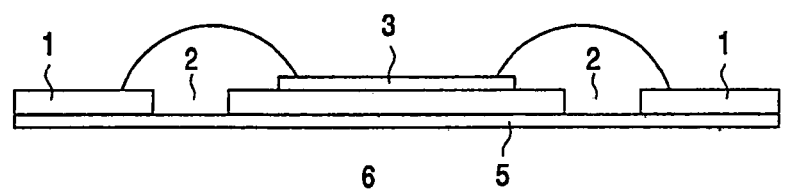
FIG. 1B shows a schematic side view of the carrier of FIG. 1A, now however an adhesive foil has been arranged on the side remote from the electronic component so as to thus close the openings in the carrier, FIG. 1C sows a schematic side view of the carrier of FIGS. 1A and 1B, now however after an encapsulation on has been arranged round the electronic component.

FIG. 1A shows a carrier 1 in which through-openings 2 are present. Placed on carrier 1 is an electronic component 3 which connects to specific parts of carrier 1 by means of connecting wires 4. FIG. 1B shows that a foil layer 5 is arranged against carrier 1 such that the openings 2 are hereby closed. For a good closure of openings 2 it is important that foil layer 5 fits properly onto carrier 1. If there is not a good connection been the foil layer 5 and carrier 1 there is after all the risk of (a function of) encapsulating material to be applied later passing between foil layer 5 and carrier 1, whereby d side of carrier 1 remote from the electronic side is contaminated and proper processing of the electronic component lame becomes difficult or impossible.

Figure 1C:
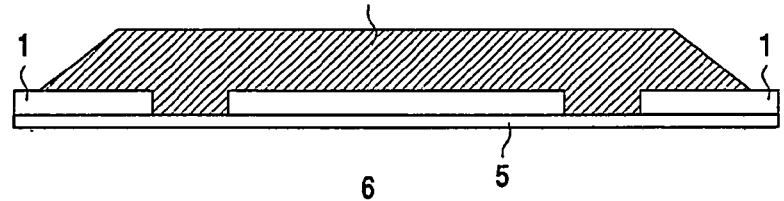
FIG. 1D shows a schematic side view of the carrier of FIGS. 1A, 1B and 1C, now however after the foil has been removed from the carrier.
Figure 1D:
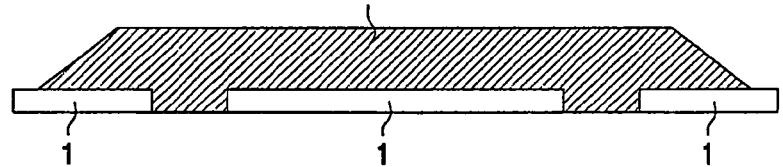

FIG. 1C shows carrier 1 with foil layer 5 after an encapsulation 6 has been arranged around electronic component 3. This encapsulation 6 is constructed from a liquid encapsulating material (for instance epoxy) which subsequently cures. Finally, FIG. 1D shows carrier 1 with encapsulation 6 after the foil layer 5 is removed from the carrier. It will be apparent that this removal is only possible once the encapsulation 6 is substantially cured. It is of great importance that foil layer 5 is removed such that the free side of carrier 1 is clean the removal.

Figure 2:
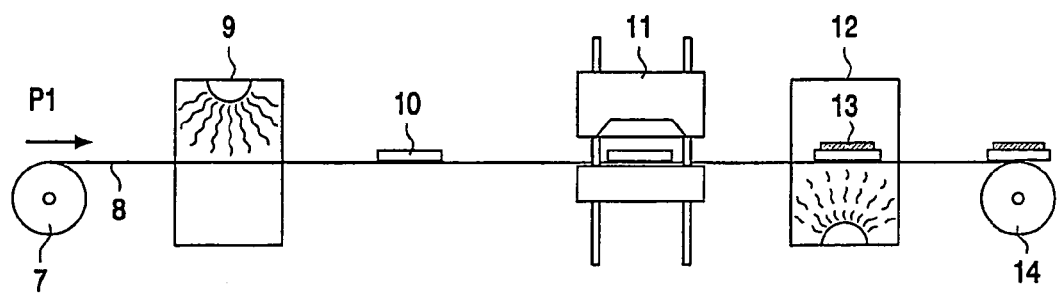

FIG. 2 shows a schematic representation of the method according to the present invention. Foil 8 is unwound from a roll 7 in a direction according to arrow P1. Foil material 8 then undergoes a schematically shown treatment 9 (for instance a corona treatment, a plasma treatment and/or a heat treatment and/or a chemical treatment) whereby the adhesion is increased, at least on one side. Electronic components 10 are then brought into contact with the activated foil material 8. After passing an encapsulating device 11 the adhesion of the foil material 8 can be reduced once again during a treatment 12 (optional). An encapsulated electronic component 13 can hereby be released relatively easily from the deactivated foil material 8. The remaining deactivated foil material 8 is wound onto a roll 14. Depending on the situation condition it is possible to envisage a roll 14 with already used foil material being utilized again during the present method.

What is claimed is:

1. A method for encapsulating an electronic component, in particular a semiconductor, fixed on a carrier, comprising the processing steps of:
   a) placing at least one foil layer in a mould,
   b) placing the carrier in contact with the foil layer with the side remote from the component, and
   c) encapsulating the electronic component with encapsulating material, wherein the adhesion of the foil layer is increased in combination with encapsulation of the electronic component, wherein the adhesion of the foil layer is increased with a separate adhesion-increasing treatment before placing the foil layer in the mould according to processing step a).

2. The method as claimed in claim 1, wherein the foil layer undergoes the adhesion-increasing treatment before the carrier is brought into contact with the foil layer.

3. The method as claimed in claim 1, wherein the adhesion-increasing treatment comprises a temperature increase of the foil.

4. The method as claimed in claim 1, wherein the adhesion-increasing treatment comprises a corona treatment or plasma treatment.

5. The method as claimed in claim 1, wherein after the adhesion-increasing treatment is performed, the foil adheres particularly to a contact surface of the carrier consisting at least substantially of copper.

6. The method as claimed in claim 1, wherein the foil undergoes a subsequent treatment after encapsulation of the electronic component with encapsulating material, whereby the adhesion of the foil layer is decreased such that it adheres less to the carrier than during encapsulation of the electronic component with encapsulating material.

7. The method as claimed in claim 6, wherein the treatment for reducing adhesion comprises a temperature decrease of the foil.

8. The method as claimed in claim 1, wherein the foil is unwound from a roll and then moved through the mould.

9. The method as claimed in claim 1, wherein the foil is used a number of times.

10. Foil for applying the method as claimed in claim 1, wherein the foil comprises a carrier layer having arranged thereon an adhesive layer which can be activated.

11. Foil as claimed in claim 10, wherein the adhesive layer which can be activated comprises a thermoplastic plastic.

12. Foil as claimed in claim 10, wherein the carrier layer consists of paper.

13. Foil as claimed in claim 10, wherein the carrier layer consists of plastic.

14. Foil as claimed in claim 10, wherein the carrier layer consists of a non-ferrous metal.

15. Foil as claimed in claim 10, wherein the foil is reusable.

* * * * *